US011423960B2

(12) United States Patent
Chang et al.

(10) Patent No.: US 11,423,960 B2
(45) Date of Patent: Aug. 23, 2022

(54) MEMORY DEVICE

(71) Applicant: TAIWAN SEMICONDUCTOR MANUFACTURING CO., LTD., Hsinchu (TW)

(72) Inventors: Meng-Sheng Chang, Hsinchu County (TW); Chia-En Huang, Hsinchu County (TW); Yi-Ching Liu, Hsinchu (TW); Yih Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/085,398

(22) Filed: Oct. 30, 2020

(65) Prior Publication Data

US 2022/0139430 A1    May 5, 2022

(51) Int. Cl.
*G11C 7/10* (2006.01)
*G11C 8/14* (2006.01)
*G11C 7/18* (2006.01)
*G11C 8/08* (2006.01)
*G11C 7/12* (2006.01)

(52) U.S. Cl.
CPC .......... *G11C 7/1051* (2013.01); *G11C 7/1006* (2013.01); *G11C 7/12* (2013.01); *G11C 7/18* (2013.01); *G11C 8/08* (2013.01); *G11C 8/14* (2013.01)

(58) Field of Classification Search
CPC ....... G11C 7/1051; G11C 7/1006; G11C 7/12; G11C 7/18; G11C 8/08
See application file for complete search history.

(56) References Cited

U.S. PATENT DOCUMENTS

| 11,011,234 | B1* | 5/2021 | Yeh ........................ G11C 16/08 |
| 2010/0195404 | A1* | 8/2010 | Lee ..................... G11C 11/5635 |
| | | | 365/185.22 |
| 2017/0236568 | A1* | 8/2017 | Rho ........................ G11C 7/12 |
| | | | 711/105 |
| 2019/0198513 | A1* | 6/2019 | Park .................. H01L 27/11524 |
| 2021/0091108 | A1* | 3/2021 | Naruke ................. G11C 16/16 |

* cited by examiner

*Primary Examiner* — Han Yang
(74) *Attorney, Agent, or Firm* — Birch, Stewart, Kolasch & Birch, LLP

(57) ABSTRACT

A memory device is disclosed, including a first switch and multiple first memory cells that are arranged in a first column, a second switch and multiple second memory cells that are arranged in a second column, a first data line and a second data line. The first data line is coupled to the first memory cells and the second memory cells. The second data line is coupled connected to the first memory cells and the second memory cells. The first switch transmits a data signal in the first data line in response to a control signal. The second switch outputs the data signal received from the second data line in response to the control signal.

20 Claims, 7 Drawing Sheets

MEMORY DEVICE

BACKGROUND

Increasing memory capacity requirements within microelectronic devices manufactured in next-generation semiconductor technology nodes combined with lower power consumption and higher speed demands has driven an increase in the number of memory cells per bit line within memory arrays. 3-Dimensional memory structure is utilized for higher memory cell density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
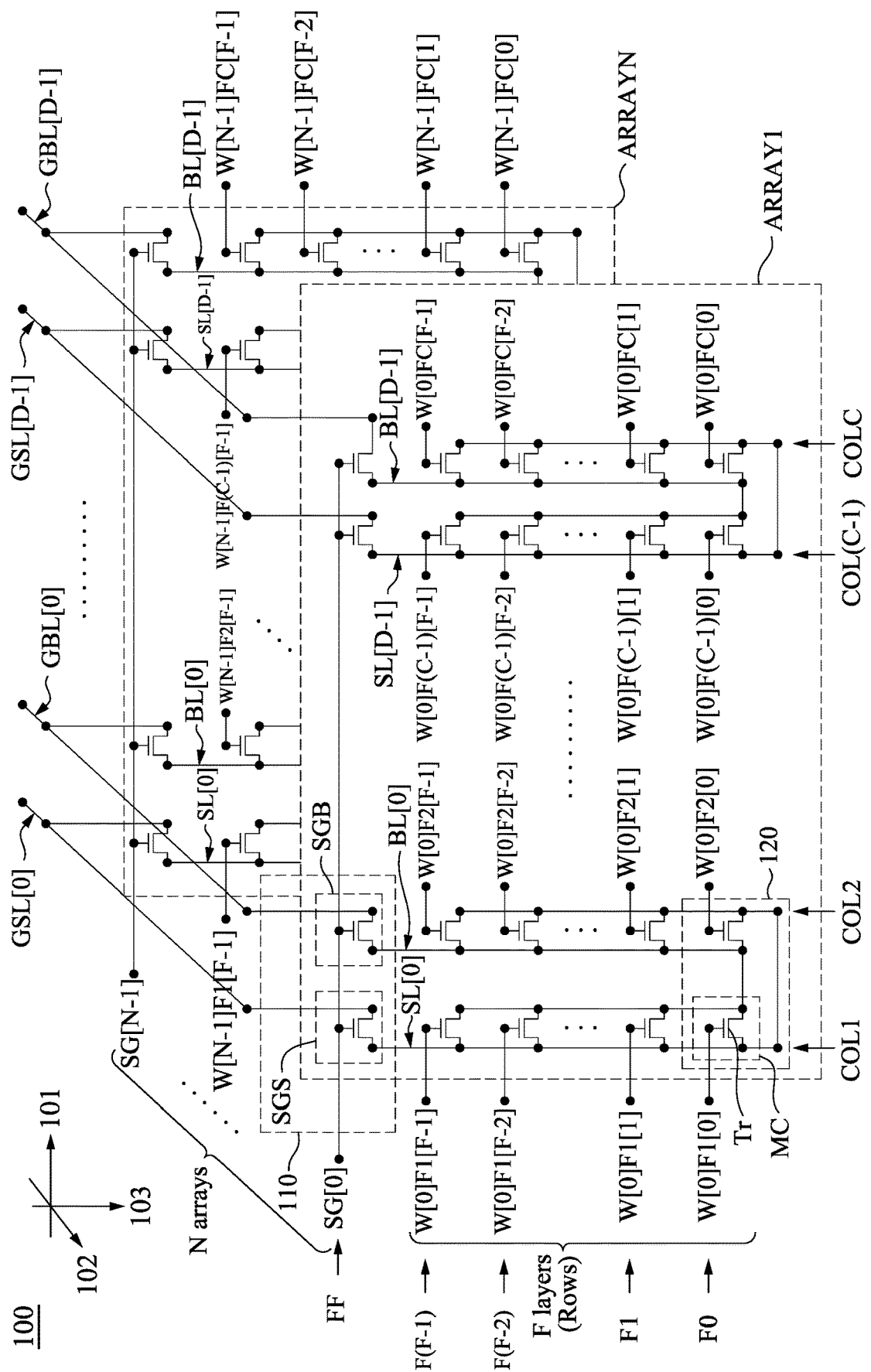
FIG. 1 is a schematic diagram of part of a memory device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in the size of the individual memory cells, and thus, to the memory density of 2D memory arrays. In response, three-dimensional (3D) memory structures, such as 3D NAND/NOR flash architecture semiconductor memory devices, are being developed to further increase memory density and lower memory costs.

In three-dimensional architecture semiconductor memory technology, as the number of tiers/layers of a memory device increases, such as by stacking vertical structures, the RC loading of bit lines and source lines increase and issue worse pre-charge and sensing speed. For example, memory cells in each memory array are coupled to local bit lines and source lines within one memory array. Global bit lines are coupled to the local bit lines of all memory arrays, and global source lines are coupled to the local source lines of all memory arrays. When a write/read operation is selectively performed to a memory cell in a particular memory array, one of the global bit lines transmits a signal to all local bit lines connected thereto. To explain in another way, the more the memory cells are, the greater the total RC loading the bit line/source line suffers from during operation. In some approaches, process challenges of manufacturing bit line/source line pillar rise. Furthermore, the increased numbers of bit lines, source lines, and word lines result in a huge area penalty. In other approaches, the number of word line drivers increases in responses to an increased number of word lines, and it is struggling to gain good area efficiency in restricted device areas including a good amount of word line drivers.

According to some embodiments of the present disclosure, a new three-dimensional memory array structure is provided to reduce the RC loading of bit lines and source lines. Memory cells are arranged in multiple columns in several memory arrays. In some embodiments, a portion of memory cells and two selection switches are arranged in two columns in a memory array and coupled to a local bit line and a local source line. The selection switches are configured to be turned on in response to a control signal. When the selection switches are turned on, a global bit line is coupled to the local bit line through one of the selection switches and a global source line is coupled to the local source line through the other one of the selection switches. Alternatively state, during the operation, the global bit line is connected to one local bit line in one memory array, without being connected to other local bit lines in other memory arrays, and the configurations of the global source line are similar to that of the global bit line. As a result, the RC loading of bit line/source line reduces.

In another embodiment of the present disclosure, word lines configured to transmit word line signals for activating memory cells in a same row and a same column of different memory arrays are coupled together. Alternatively stated, multiple word lines are coupled with each other and configured to receive a word line signal from a word line decoder. As the selection switches are turned on to selectively conduct specific bit lines and source lines, a corresponding memory cell is selectively activated even activate word line signals are transmitted to several memory cells. As a result, the number of needed word line decoders decreases, compared with some approaches including word line decoders for each word line. In consequence, the area consumption for those word line decoders reduces.

Reference is now made to FIG. 1. FIG. 1 is a schematic diagram of part of a memory device 100, in accordance with various embodiments. In some embodiments, the memory device 100 represents a portion of a greater number of similar structures that is typically found in a block, device, or other unit of memory. As illustratively shown in FIG. 1, the memory device 100 includes several memory arrays ARRAY1-ARRAYN. The memory arrays ARRAY1-ARRAYN are separated from each other in a direction 102, i.e., y direction. For illustration, each one of the memory arrays ARRAY1-ARRAYN includes multiple strings of memory cells MC arranged in rows and columns COL1-COLC. The rows extend in a direction 101 (i.e., x direction), and the memory cells MC in the rows are referred to as being arranged in layers FL0-FL(F-1) of the memory device 100, in some embodiments. Alternatively stated, the memory cells are stacked in a direction 103, i.e., z direction, or stacked vertically in the layers. A number C of columns COL1-COLC extend in the direction 103, in which C is a positive integer. In some embodiments, the memory cell MC includes a transistor Tr having a source, a drain, and a control gate, as shown in FIG. 1. In various embodiments, the transistor Tr is a charge storage transistor, and in other embodiments, the transistor Tr has charge trapping structures or other forms of storage structures. The configurations of the memory cells MC in FIG. 1 are given for illustrative purposes. Various implements of the memory cells MC are within the contemplated scope of the present disclosure. For example, in some embodiments, the memory cells MC further include resistive elements. In various embodiments, the memory cells MC are of any suitable type of memory architecture.

For illustration, each of the memory arrays ARRAY1-ARRAYN includes multiple layers of memory structures, including, access lines. As shown in FIG. 1, the memory array ARRAY1 has, for example, word lines W[0]F1[0]-W[0]F1[F-1] coupled to control gates of the memory cells MC in the column COL1, word lines W[0]F2[0]-W[0]F2[F-1] coupled to control gates of the memory cells MC in the column COL2, and so on. Similarly, the memory array ARRAYN has, for example, word lines W[N-1]F1[0]-W[N-1]F1[F-1] coupled to the memory cells MC in the column COL1, word lines W[N-1]F2[0]-W[N-1]F2[F-1] coupled to the memory cells MC in the column COL2, and so on.

In some embodiments, the word lines included in the memory arrays ARRAY1-ARRAYN are located at separate layers of the memory device 100. For instance, the word lines W[0]F1[F-1]-W[0]FC[F-1] are located in the layer FL(F-1), and the word lines W[0]F1[F-2]-W[0]FC[F-2] are located in the layer FL(F-2) below the first layer along the direction 103. As shown in FIG. 1, the memory device 100 includes a number F of the layers, in which F is a positive integer, such as 8, 16, 32, 64, etc.

For illustration, the memory arrays ARRAY1-ARRAYN further include multiple data lines, for example, including source lines SL[0]-SL[D-1] and bit lines BL[0]-BL[D-1]. In some embodiments, the number D is half of the number C. As illustratively shown in FIG. 1, the bit line BL[0] is coupled to terminals of the memory cells arranged in the columns COL1-COL2, and the source line SL[0] is coupled to other terminals of the memory cells arranged in the columns COL1-COL2. Specifically, in some embodiments, the bit line BL[0] includes first and second portions extending in the direction 103 and a third portion extending in the direction 101. The source line SL[0] also includes three portions, which first and second portions extend in the direction 103 and a third portion extends in the direction 101. Alternatively stated, the source line SL[0] and bit line BL[0] have a U-shape structure. In various embodiments, the third portion of the source line SL[0] is located below the third portion of the bit line BL[0] along the direction 103. The configurations of the source lines SL[1]-SL[D-1] and the bit lines BL[1]-BL[D-1] are similar to that of the source line SL[0] and the bit line BL[0]. Thus, the repetitious descriptions are omitted here.

As shown in FIG. 1, the memory arrays ARRAY1-ARRAYN further include multiple selection switches SGS and SGB. In some embodiments, the selection switches SGS and SGB are arranged above the memory cells MC in the direction 103. Specifically, the selection switches SGS and SGB are located in a layer FLF above the layer FL(F-1). The selection switches SGS are arranged in the odd columns, including, for example, the columns COL1, COL3, and so on. The selection switches SGB are arranged in the even columns, including, for example, the columns COL2, COL4, and so on. For illustration, control gates of the selection switches SGS and SGB in a same layer of a same memory array are coupled together to a control line, for example, one of selection lines SG[0]-SG[N-1]. As an example, one terminal of the selection switch SGS in the column COL1 of the memory array ARRAY1 is coupled to the source line SL[0], and one terminal of the selection switch SGB in the column COL2 of the memory array ARRAY1 is coupled to the bit line BL[0]. The configurations of other selection switches in the memory arrays ARRAY1-ARRAYN are similar to that of the selection switches in the columns COL1-COL2 of the memory array ARRAY1. Thus, the repetitious descriptions are omitted here.

The memory device 100 further includes multiple data lines, for example, global source lines GSL[0]-GSL[D-1] and global source lines GBL[0]-GBL[D-1]. As an example, the global source line GSL[0] is coupled to other terminals of the selection switches SGS in the columns COL1 of the memory arrays ARRAY1-ARRAYN, and the global bit line GBL[0] is coupled to other terminals of the selection switches SGB in the columns COL2 of the memory arrays ARRAY1-ARRAYN. In some embodiments, each of the global source lines GSL[0]-GSL[D-1] and global source lines GBL[0]-GBL[D-1] has a portion extending in the direction 102.

With continued reference to FIG. 1, in some embodiments, signal combinations applied to the selection lines SG[0]-SG[N-1] and the word lines in FIG. 1 define an operation, such as a read/programming operation, to a selected one of the memory cells MC. The selected memory cell MC is activated in response to a word line signal and configured to transmit a data signal, representing a state of the memory cell MC, through a bit line and a source line.

Specifically, for example, during the operation, the selection switches SGS and SGB in the memory arrays ARRAY1-ARRAYN are configured to be turned on in response to received control signals CS[0]-CS[N-1] separately. In some embodiments, the selection switches SGS and SGB coupled to the selection line SG[0] in the memory array ARRAY1 are turned on in response to the control signal CS[0] having a logic high value, i.e., 1. The selection switches SGS and SGB in other memory arrays ARRAY2-ARRAYN are turned off in response to the control signals CS[1]-CS[N-1] having a logic low value, i.e., 0. Accordingly, the global source lines GSL[0]-GSL[D-1] are electrically coupled to the source lines SL[0]-SL[D-1] in the memory array ARRAY1 through the selection switches SGS in the memory array ARRAY1. The global bit lines GBL[0]-GBL[D-1] are electrically coupled to the bit lines BL[0]-BL[D-1] in the memory array ARRAY1 through the selection switches SGB in the memory array ARRAY1. For instance, the global source line GSL[0] is coupled to the source line SL[0] in the memory array ARRAY1 through the selection switch SGS in the column COL1 of the memory array ARRAY1. Similarly, the global bit line GBL[0] is coupled to the source line BL[0] in the memory array ARRAY1 through the selection switch SGB in the column COL2 of the memory array ARRAY1.

Moreover, in the embodiment mentioned above, for example, an activate word line signal having the logic high value (i.e., 1) is transmitted to the word line W[0]F1 [F-1], the respective memory cell MC in the layer FL(F-1) of the memory array ARRAY1 is activated in response to the word line signal. In the meantime, word line signals having the logic low value (i.e., 0) are transmitted to the rest of word lines in the memory device 100. Accordingly, the memory cell MC coupled to the word line W[0]F1[F-1] is selected to be operated to transmit a data signal corresponding to a logic state of the selected memory cell MC through the selection switch SGB, the bit line BL[0], the source line SL[0], and the selection switch SGB. Alternatively stated, the selection switch SGS is configured to transmit the data signal in the source line SL[0] to the global source line GSL[0]. The selection switch SGB is configured to output the data signal received from the bit line BL[0] to the global bit line GBL[0]. The selection switches SGS and SGB are controlled by the control signal CS[0]. In some embodiments, the global bit line GBL[0] transmits the data signal to a sense amplifier (not shown) to determine the stored state of the memory cell MC.

As mentioned above, in the embodiments of FIG. 1, two of the memory cells MC arranged adjacent to each other in a row direction (i.e., the direction 101) are configured to be activated in response to different word line signals. For example, the word lines in the layer FL(F-1) of the memory array ARRAY1 are isolated from each other. Accordingly, memory cells coupled to the word lines in the layer FL(F-1) are activated in response to different word line signals.

Specifically, the memory cells coupled to the source line SL[0] and the bit line BL[0] are activated in response to different word line signal received from the word lines W[0]F1[0]-W[0]F1[F-1] and W[0]F2[0]-W[0]F2[F-1]. The configurations of other memory cells MC in the memory device 100 are similar to that of the exemplary memory cells MC in the memory array ARRAY1. Thus, the repetitious descriptions are omitted here.

In some approaches, memory cells in each column of each memory array are coupled to a pair of a source line and a bit line. Source lines in the same column (for example, a first column) of all memory arrays are coupled together to a global source line, and bit lines in the same column of all memory arrays are coupled together to a global bit line. Alternatively stated, when there are C columns in memory arrays, a total number 2C of global source lines and global bit lines are required in a memory device. In contrast, with the configurations of the present disclosure as shown in FIG. 1, the source line for two columns are coupled together with one global source line and the bit line for two columns are coupled together with one global bit line. Therefore, the memory device merely has a total number C of global source lines and global bit lines, which the number is half of that in some approaches. Accordingly, routing resource is preserved in the memory device in the present disclosure.

Furthermore, in some aforementioned approaches, the global source lines/global bit lines are directly coupled to the source lines/bit lines without having selection switches as shown in FIG. 1. Thus, for example, when one global source line is selected and conducted, it is electrically conducted with all source lines coupled thereto. To state it in another way, the one global source line experiences RC loading contributed by all coupled source lines. The longer the source lines get longer in response to more layers included in the memory device, the greater loading the global source line has. For instance, there are N memory arrays (i.e., a total number N of source lines coupled to one global source line) having a number F of layers, and accordingly, a total RC loading experienced by one global source bit is in direct proportion to a number N times F.

With the configurations of the present disclosure, when one global source line is selected and conducted, it is electrically conducted with only one source line through one selection switch SGS. Accordingly, the one global source line experiences smaller RC loading contributed by the source line, compared with some approaches. For example, in some approaches, a capacitance of source lines contributed to the global source line in a memory device having 16 memory arrays without selection switches is 100 units. With the configurations of the present disclosure, a capacitance of source lines contributed to the global source line is cut to 6.3 units. In various approaches, a capacitance of source lines contributed to the global source line in a memory device having 64 memory arrays without selection switches is 800 units. With the configurations of the present disclosure, a capacitance of source lines contributed to the global source line is cut to 6.4 units. As discussed above, the pre-charge process/speed and sensing speed of the memory device with configurations of the present disclosure improve.

The configurations of FIG. 1 are given for illustrative purposes. Various implements are within the contemplated scope of the present disclosure. For example, in some embodiments, the control signals having the logic low value are configured to turn on the selection switches. Various suitable signals are utilized to implement the present disclosure alternatively according to actual applications.

In various embodiments, the directions 103 and 101 are x and y directions respectively for defining a layout plane. The direction 102 is z direction. Alternatively stated, the memory arrays of the present disclosure extend in x-y plane, and the global source lines and global bit lines extend in z direction.

Figure 2:
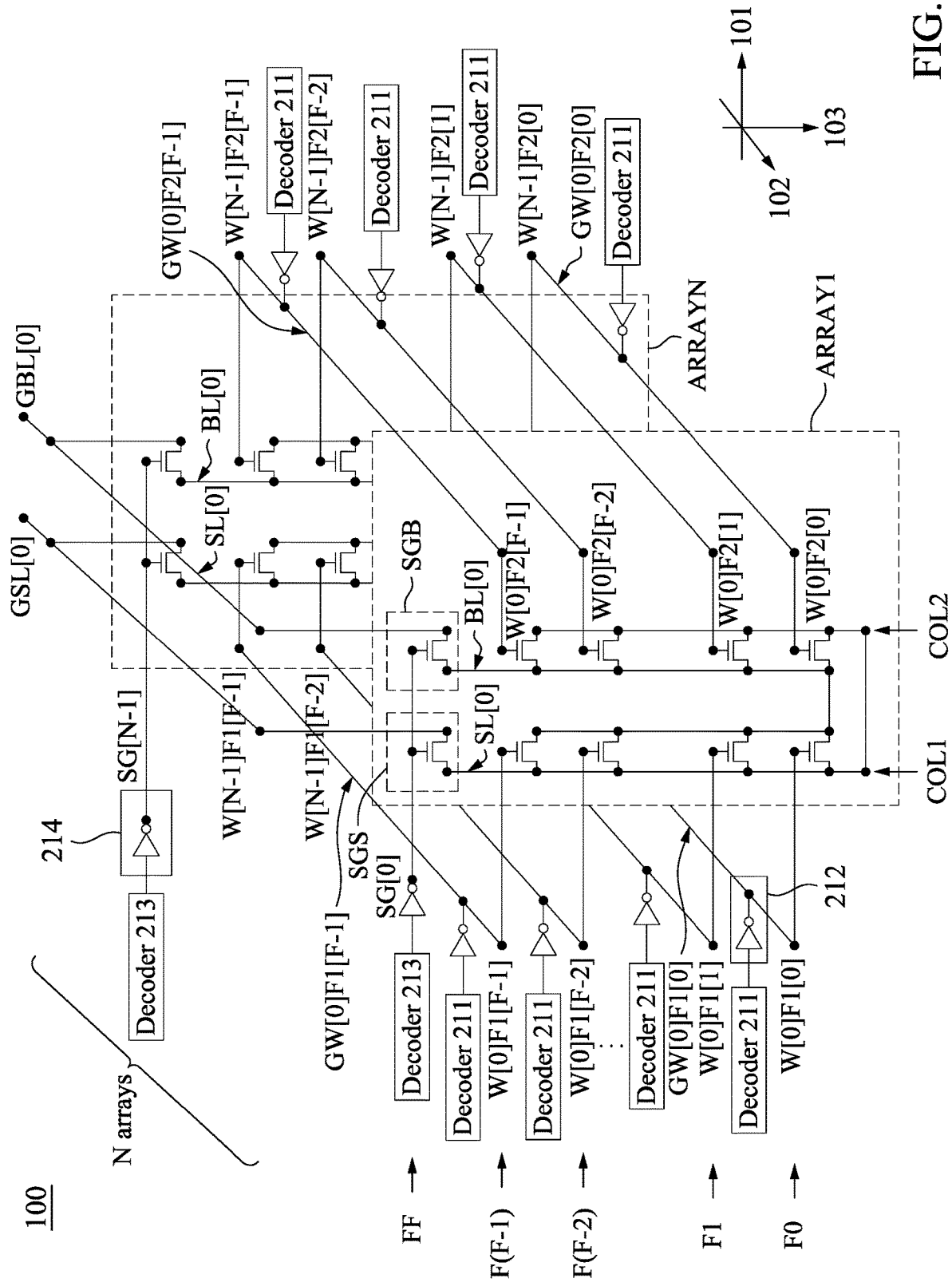
FIG. 2 is a schematic diagram of part of the memory device in FIG. 1, in accordance with various embodiments.

Reference is now made to FIG. 2. FIG. 2 is a schematic diagram of part of the memory device 100 in FIG. 1, in accordance with various embodiments. As illustratively shown in FIG. 2, the memory device 100 further includes several global word lines GW[0]F1[0]-GW[0]F1 [F-1] and GW[0]F2[0]-GW[0]F2[F-1], decoders 211, inverters 212, decoders 213, and inverters 214. For illustration, a global word line GW[0]F1[F-1] is coupled to memory cells arranged in the layers (i.e., the row) FLF and the columns COLI in the memory arrays ARRAY1-ARRAYN. The decoder 211 is coupled to the global word line GW[0]F1 [F-1] through the inverter 212. The configurations of other decoders 211, inverters 212, and the global word lines in the memory device 100 are similar to those mentioned above. Thus, the repetitious descriptions are omitted here. The decoders 213 are coupled to the selection lines SG[0]-SG[N-1] through the inverters 214. For the sake of simplicity, several decoders, inverters, and global word lines coupled to the word lines included in the memory device 100 and having similar configurations of illustrated elements in FIG. 2 are omitted here.

In operation, for example, the decoder 211 is configured to receive a word line address and output the word line signal through the inverter 212 to the GW[0]F1[F-1]. The word line signal is further transmitted to the memory cells through the word lines W[0]F1[0]-W[0]F1[F-1] to activate the memory cells MC. The decoders 213 are configured to transmit the control signals CS[0]-CS[N-1] to the selection lines SG[0]-SG[N-1] through the inverters 214. In the aforementioned embodiments, the selection switches SGS and SGB coupled to the selection line SG[0] are turned on, in response to the activated control signal CS[0], and the memory cell MC coupled to the word line W[0]F1[F-1] is activated. The memory cell MC transmits the data signal through the global source line GSL[0], the global bit line GBL[0], and the source line SL[0], the bit line BL[0] in the memory array ARRAY1, as shown in FIG. 2. Alternatively stated, by selectively turning on the selection switches SGS and SGB, a specific one memory cell MC among memory cells coupled to the same global word line is activated to transmit data signal.

In some approaches without the configurations of the selection switches, one decoder is equipped for one of memory cells in different layers of different memory arrays. For instance, a memory device has 32 layers in each of 4 memory arrays, and a total of 128 decoders are required to selectively activate memory cells. In contrast, with the configurations of the selection switches in the present disclosure, one decoder 211 per layer is shared with 4 memory arrays. Accordingly, a total of 36 decoders (i.e., 32 decoders for global word lines for 32 layers and decoders for 4 series of selection switches in 4 memory arrays) are required. Alternatively stated, the present disclosure cuts around 71.8% usage of decoders in the memory device, compared with some approaches. In various approaches, a memory device has 64 layers in each of 8 memory arrays, and a total of 512 decoders are required. In contrast, with the configurations of the selection switches in the present disclosure, a total of 72 decoders (i.e., 64 decoders for global word lines for 64 layers and decoders for 8 series of selection switches in 8 memory arrays) are required. Alternatively stated, the present disclosure cuts around 85.9% usage of decoders in the memory device, compared with some approaches.

The configurations of FIG. 2 are given for illustrative purposes. Various implements are within the contemplated scope of the present disclosure. For example, in some embodiments, the inverters 212 and 214 are omitted.

Figure 3:
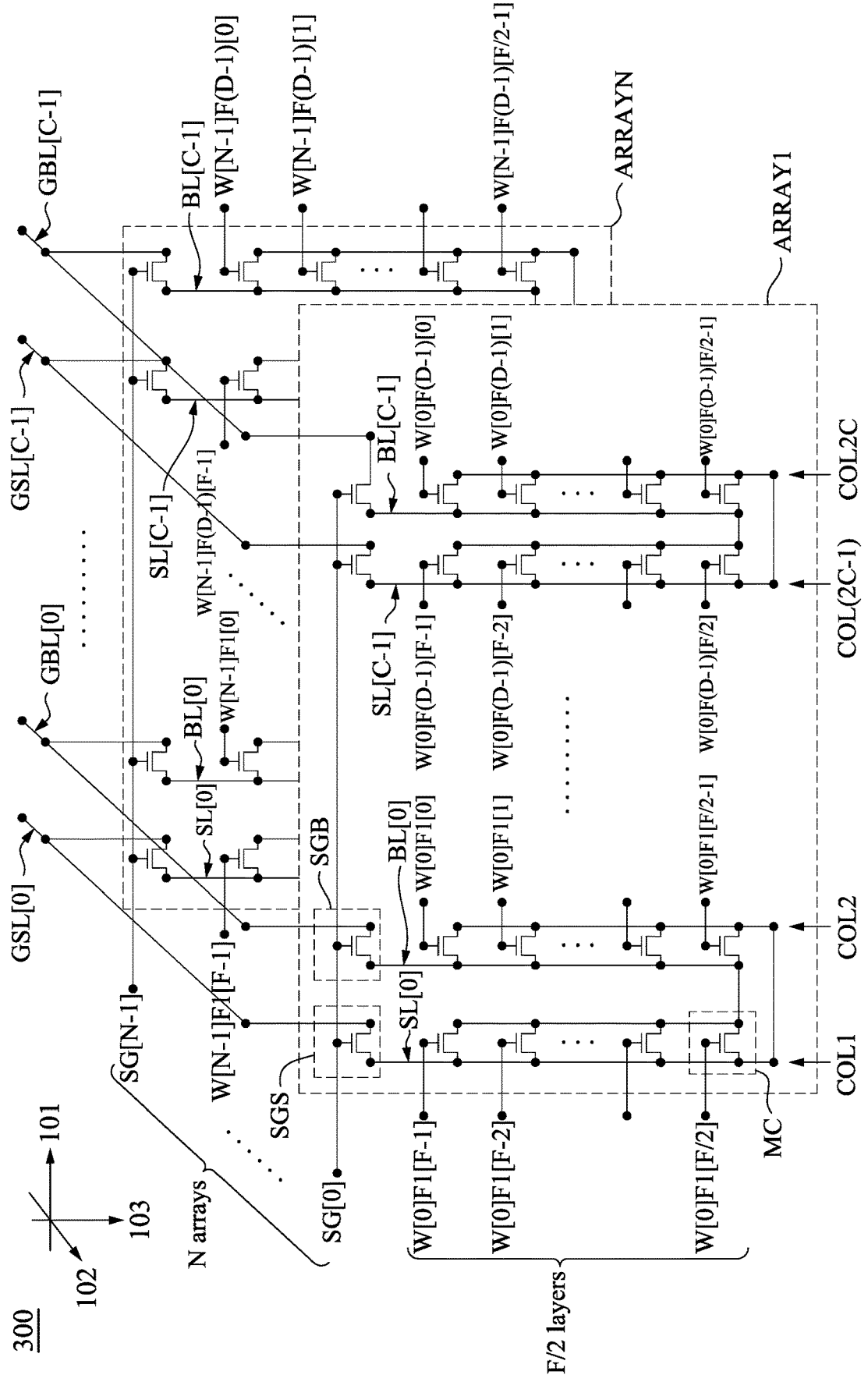
FIG. 3 is a schematic diagram of part of a memory device, in accordance with various embodiments.

Reference is now made to FIG. 3. FIG. 3 is a schematic diagram of part of a memory device 300, in accordance with various embodiments. With respect to FIGS. 1-2, like elements in FIG. 3 are designated with the same reference numbers for ease of understanding. The specific operations of similar elements, which are already discussed in detail in the above paragraphs, are omitted herein for the sake of brevity, unless there is a need to introduce the co-operation relationship with the elements shown in FIG. 3.

Compared with FIG. 1, the memory device 300 includes a double amount of the global source lines, global bit lines, source lines, and bit lines and a half number of layers. For illustration, the memory device 300 includes global source lines GSL[0]-GSL[C-1], global bit lines GBL[0]-GBL[C-1], source lines SL[0]-SL[C-1], and bit lines BL[0]-BL[C-1] in a number 2C of columns COLI-COL2C, and a number of F/2 layers. In FIG. 3, as an example, the word lines W[0] F1[F/2]-W[0]F1[F-1] are coupled to memory cells MC arranged in the column COL1 of the memory array ARRAY1, and the word lines W[0]F1[F/2-1]-W[0]F1[0] are coupled to memory cells MC arranged in the column COL2 of the memory array ARRAY1. The configurations of other word lines in the memory device 300 are similar to that of the word lines W[0]F1[0]-W[0]F1[F-1]. Thus, the repetitious descriptions are omitted here.

The configurations of FIG. 3 are given for illustrative purposes. Various implements are within the contemplated scope of the present disclosure. For example, in some embodiments, instead of having a double number of columns, the memory device includes more memory arrays having a half number of layers, compared with the embodiments in FIG. 1.

Figure 4:
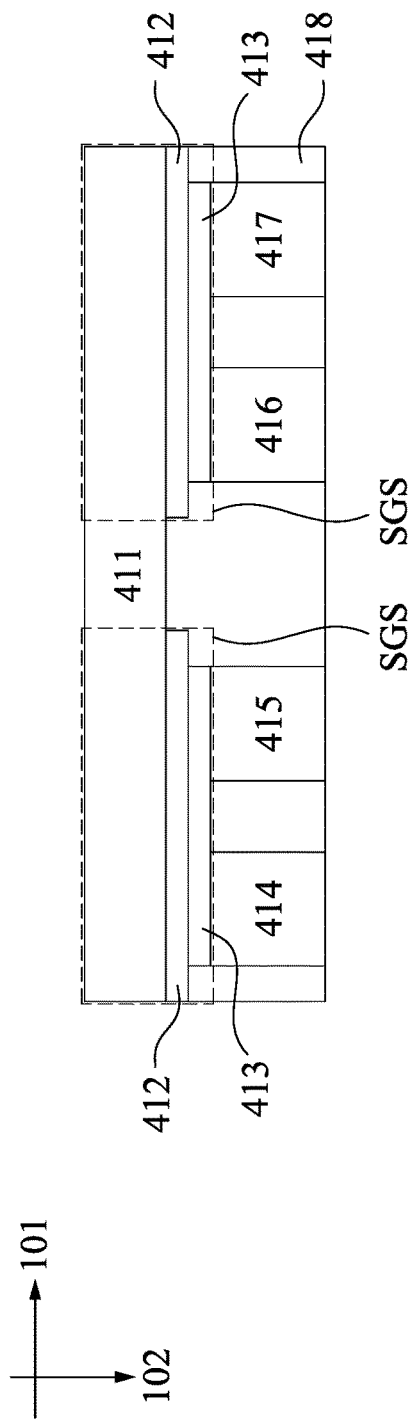
FIG. 4 is a layout diagram in a plan view of part of the memory devices in FIG. 1, in accordance with various embodiments.

Reference is now made to FIG. 4. FIG. 4 is a layout diagram in a plan view of part of the memory device 100 circled as a region 110 in FIG. 1, in accordance with various embodiments. With respect to FIGS. 1-3, like elements in FIG. 4 are designated with the same reference numbers for ease of understanding.

As illustratively shown in FIG. 4, in some embodiments, a conductive portion 411 corresponds to the selection line SG[0] in FIG. 1. A portion of the conduction portion 411, a gate oxide portion 412, and a transistor channel region 413 are included in a semiconductor structure corresponding to the selection gate SGS in FIG. 1. Another portion of the conduction portion 411, another gate oxide portion 412, and another transistor channel region 413 are included in a semiconductor structure corresponding to the selection gate SGB in FIG. 1. A conductive line 414 corresponds to the source line SL[0] in FIG. 1. A conductive line 415 corresponds to the global source line GSL[0] in FIG. 1. A conductive line 416 corresponds to the bit line BL[0] in FIG. 1. A conductive line 417 corresponds to the global bit line GBL[0] in FIG. 1.

For illustration, the conductive portion 411, the gate oxide portions 412, the transistor channel regions 413 extend in the direction 101. The gate oxide portion 412 are separated from each other in the direction 101, and the transistor channel regions 413 are separated from each other in the direction 101. The conductive lines 414-415 are attached to the transistor channel region 413 included in the selection switch SGS. The conductive lines 416-417 are attached to the transistor channel region 413 included in the selection switch SGB. The conductive portion 411, the gate oxide portions 412, the transistor channel regions 413, and the conductive lines 414-417 are surrounded by an oxide region 418.

In some embodiments, when the control signal CS[0] is transmitted with a voltage to the selection line SG[0] to turn on the selection switches SGS and SGB, a current, representing the data signal, flows in the conductive lines 414-417 through the transistor channel region 413.

Figure 5:
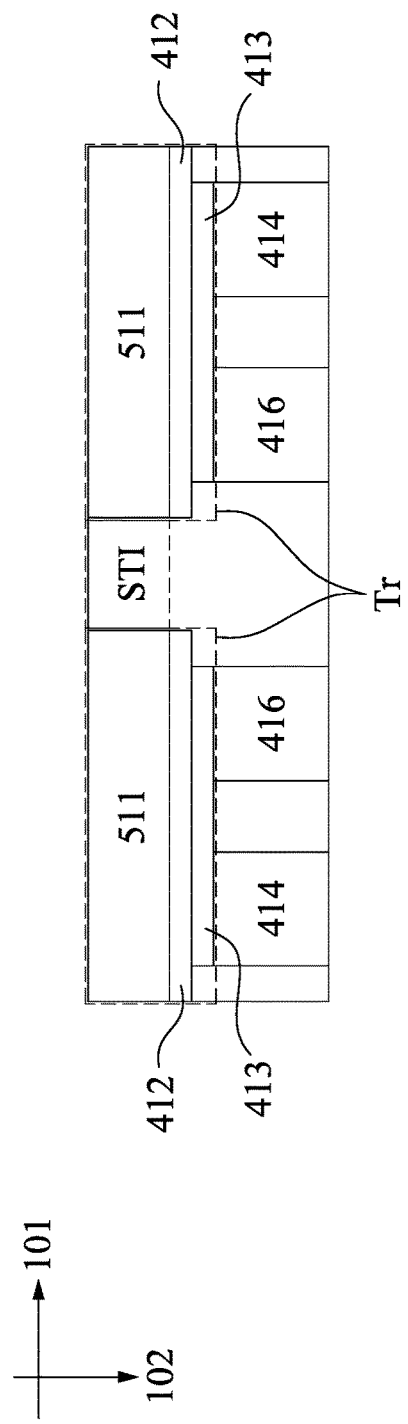
FIG. 5 is a layout diagram in a plan view of part of the memory devices in FIG. 1, in accordance with various embodiments.

Reference is now made to FIG. 5. FIG. 5 is a layout diagram in a plan view of part of the memory device 100 circled as a region 120 in FIG. 1, in accordance with various embodiments. With respect to FIGS. 1-4, like elements in FIG. 5 are designated with the same reference numbers for ease of understanding. For the sake of simplicity, corresponding memory cell structures are not shown in FIG. 5.

As illustratively shown in FIG. 5, in some embodiments, conductive portions 511 correspond to the word lines W[0] F1[0] and W[0]F2[0] in FIG. 1. A shallow trench isolation (STI) is arranged between two conductive portions 511. In some embodiments, the conductive portions 511, the gate oxide portions 412, and the transistor channel regions 413 are included in a semiconductor structure corresponding to the transistors Tr in FIG. 1. The conductive line 414 corresponding to the source line SL[0] in FIG. 1 is arranged next to the conductive line 415 corresponding to the conductive line 416 corresponds the bit line BL[0] in FIG. 1.

In some embodiments, the conductive portions 411, 511, the conductive lines 414-417 include, for example, a conductive material selected from a group comprising of polycrystalline-silicon (poly-Si), poly-crystalline silicon-germanium (poly-SiGe), metal materials, and the like. For example, metal materials may include tantalum, titanium, molybdenum, tungsten, copper, a combination thereof and the like. The gate oxide portions 412 include materials for isolation, for example, nitride, aluminum oxide, and any high-k with trap characteristics for charge-based memory applications as the memory cell MC, and Perovskite, strontium bismuth tantalite (SBT), lead zirconium titanate (PZT), hafnium zirconium oxide (HfZrOx), hafnium oxide (HfO) and any ferroelectric characteristics for ferroelectric-based memory applications as the memory cell MC. The transistor channel regions 413 include for example, a conductive material of polycrystalline-silicon (poly-Si), low-temperature polycrystalline silicon (LTPS), amorphous silicon, indium gallium zinc oxide (IGZO) and any semi-conductor characteristic material.

Figure 6A:
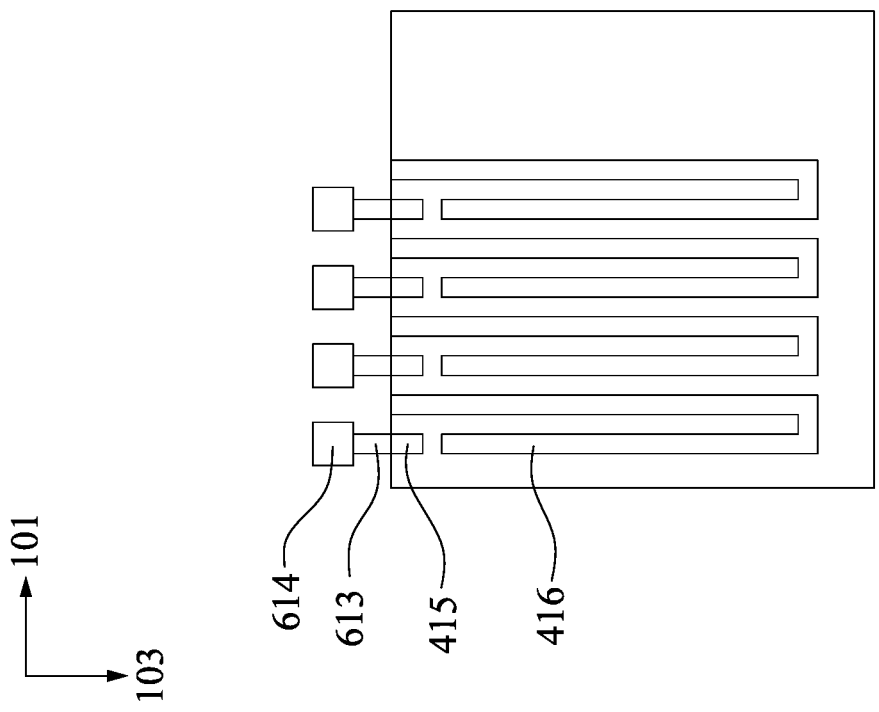
FIG. 6A is a cross-sectional view of part of the memory devices in FIG. 1, in accordance with various embodiments.

Reference is now made to FIG. 6A. FIG. 6A is a cross-sectional view of part of the memory devices in FIG. 1, in accordance with various embodiments. With respect to FIGS. 1-5, like elements in FIG. 6A are designated with the same reference numbers for ease of understanding. For the sake of simplicity, corresponding memory cell structures, the selection switches, word lines and bit lines are not shown in FIG. 6A.

As shown in FIG. 6A, the conductive line 414 has a U-shaped structure including first and second portion extending in the direction 103 and a third portion extending in the direction 101 to couple the first and second portions of the conductive line 414. In some embodiments, the conductive line 417, a via 611, and a conductive line 612 are included in a structure corresponding to the global bit line BL[0]. The conductive lines 414 and 417, the via 611, and the conductive line 612 are arranged in a repetitious way along the direction 101.

Figure 6B:
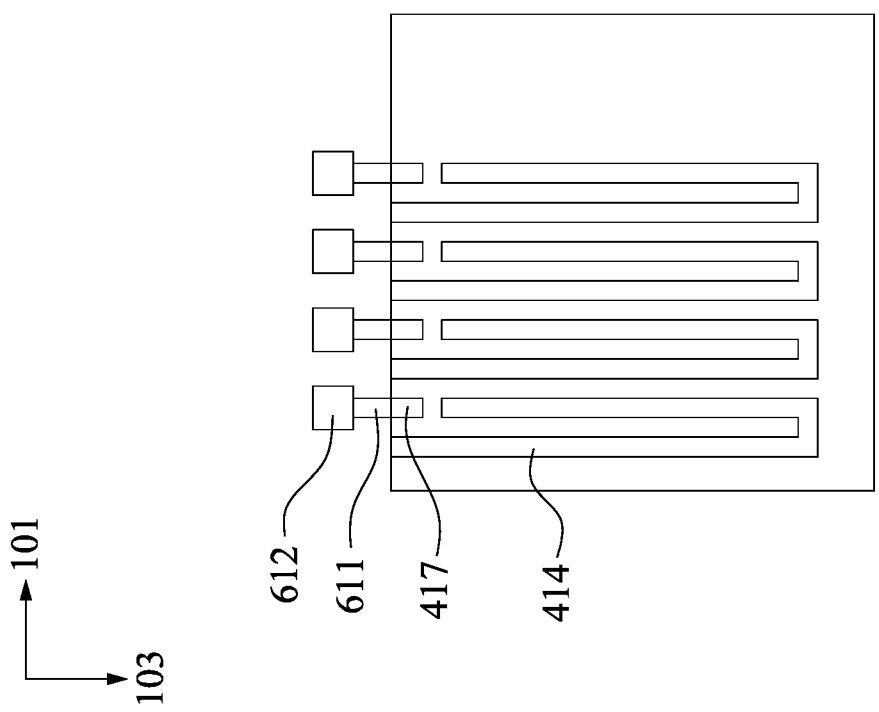
FIG. 6B is a cross-sectional view of part of the memory devices in FIG. 1, in accordance with various embodiments.

Reference is now made to FIG. 6B. FIG. 6B is a cross-sectional view of part of the memory devices in FIG. 1, in accordance with various embodiments. With respect to FIGS. 1-6A, like elements in FIG. 6B are designated with the same reference numbers for ease of understanding. For the sake of simplicity, corresponding memory cell structures, the selection switches, word lines and source lines are not shown in FIG. 6B.

As shown in FIG. 6B, the conductive line 416 has a U-shaped structure including first and second portion extending in the direction 103 and a third portion extending in the direction 101 to couple the first and second portions of the conductive line 416. In some embodiments, the conductive line 415, a via 613, and a conductive line 614 are included in a structure corresponding to the global source line SL[0]. The conductive lines 415-416, the via 613, and the conductive line 614 are arranged in a repetitious way along the direction 101.

The configurations of FIGS. 4-6B are given for illustrative purposes. Various implements are within the contemplated scope of the present disclosure. For example, in some embodiments, the sizes and geometry of the source lines and the bit lines are different.

Figure 7:
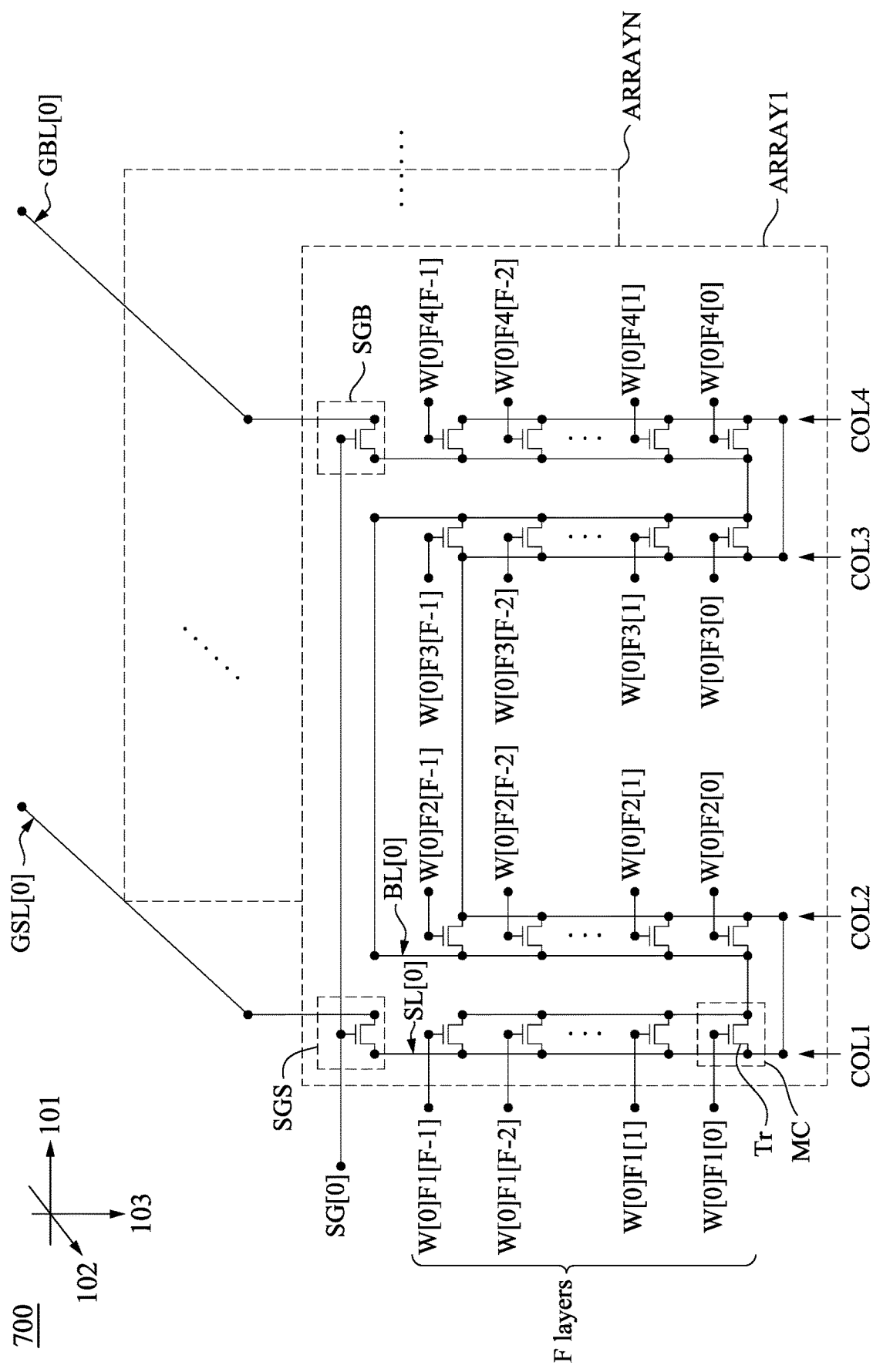
FIG. 7 is a schematic diagram of part of a memory device, in accordance with various embodiments.

Reference is now made to FIG. 7. FIG. 7 is a schematic diagram of part of a memory device 700, in accordance with various embodiments. With respect to FIGS. 1-6B, like elements in FIG. 7 are designated with the same reference numbers for ease of understanding.

Compared with the embodiments of FIG. 1, instead of one source/bit line coupling memory cells in two columns, for example, the source line SL[0] in the memory array ARRAY1 of the memory device 700 is coupled to the memory cells MC arranged in four columns COL1-COL4. Similarly, the bit line BL[0] is coupled to the memory cells MC arranged in four columns COL1-COL4. Furthermore, as shown in FIG. 7, the bit line BL[0] and the source line SL[0] further have a fourth portion extending in the direction 101 to couple the memory cells MC in the columns COL2-COL3.

As shown in FIG. 7, instead of having the selection switches in each column, the memory device 700 has selection switches in the first and last columns to which the global source line GSL[0] and the global bit line GBL[0] extend. Alternatively stated, the number of selection switches reduces, compared to the embodiments in FIGS. 1 and 3.

The configurations of memory arrays ARRAY2-ARRAYN are similar to that of the memory array ARRAY1. Thus, the repetitious descriptions are omitted here.

The configurations of FIG. 7 are given for illustrative purposes. Various implements are within the contemplated scope of the present disclosure. For example, in some embodiments, one source/bit line is coupled to more than four columns of memory cells MC.

Figure 8:
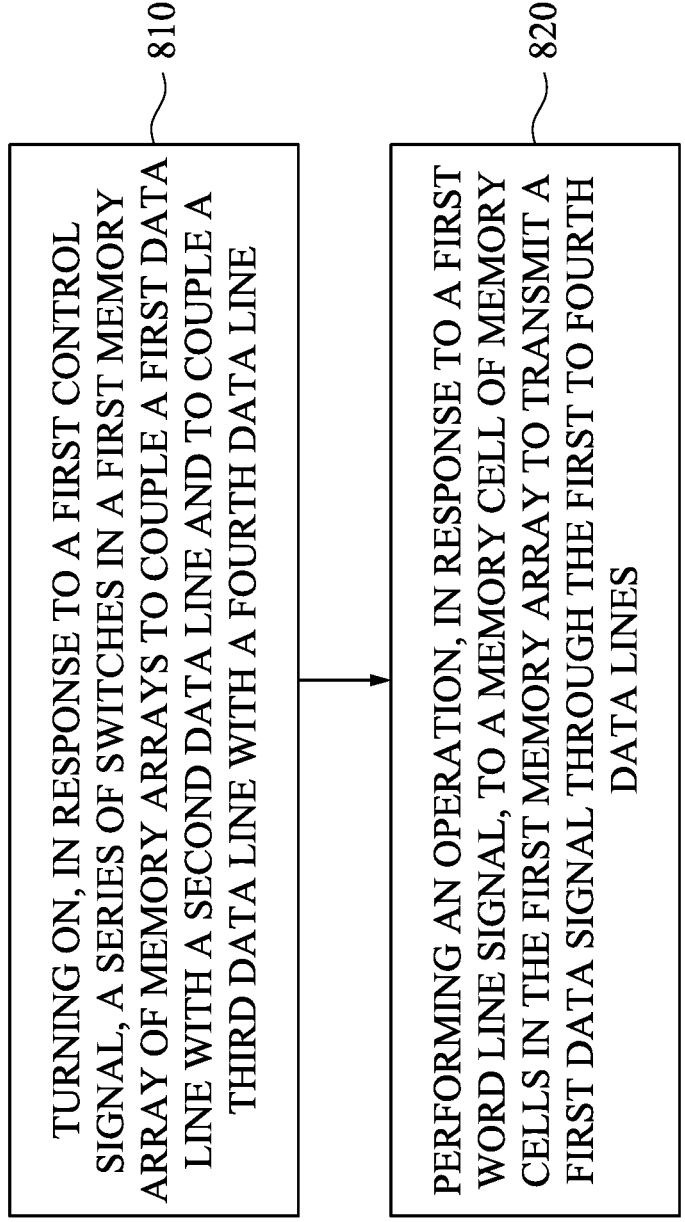
FIG. 8 is a flow chart of a method of operating a memory device, in accordance with some embodiments of the present disclosure.

Reference is now made to FIG. 8. FIG. 8 is a flow chart of a method 800 of operating a memory device, including, for example, the memory devices 100, 300, in accordance with some embodiments of the present disclosure. It is understood that additional operations can be provided before, during, and after the processes shown by FIG. 8, and some of the operations described below can be replaced or eliminated, for additional embodiments of the method. The order of the operations/processes may be interchangeable. Throughout the various views and illustrative embodiments, like reference numbers are used to designate like elements.

The method 800 includes operations 810-820 that are described below with reference to the memory device 100 of FIG. 1.

In operation 810, according to some embodiments, the selection switches SGS and SGB coupled to the selection line SG[0] in the memory array ARRAY1 are turned on, in response to the control signal CS[0]. For example, the selection switch SGS couples the source line SL[0] to the global source line GSL[0], and the selection switch SGB couples the bit line BL[0] to the global bit line GBL[0]. As shown in FIG. 1, the memory cells MC have first terminals coupled to the source line SL[0] and second terminals coupled to the bit line BL[0].

In operation 820, an operation (i.e., a read operation) is performed, in response to a word line signal, to one of the memory cells MC in the memory array ARRAY1 to transmit the data signal through the global source line GSL[0], the source line SL[0], the bit line BL[0], and the global bit line GBL[0]. For example, the memory cell MC coupled to the word line W[0]F1[F-1] is accessed during operation in response to the word line signal transmitted in the global word line GW[0]F1 [F-1] and the word line W[0]F1[F-1].

In some embodiments, when the selection switches SGS and SGB coupled to the selection line SG[0] in the memory array ARRAY1 are turned off, the method 800 further includes operations of turning on another series of selection switches, for example, the selection switches SGS and SGB coupled to the selection line SG[N-1] in the memory array ARRAYN. Specifically, the selection switch SGS couples the source line SL[0] in the memory array ARRAYN to the global source line GSL[0]. The selection switch SGB couples the bit line BL[0] in the memory array ARRAYN to the global bit line GBL[0].

In some embodiments, the selection switches SGS and SGB coupled to the selection line SG[N-1] in the memory array ARRAYN are turned on. The method 800 further includes operations of performing an operation, in response to the word line signal, to one of the memory cells MC coupled to the source line SL[0] and the bit line BL[0] in the memory ARRAYN to transmit another data signal. The word line signal is transmitted in the global word line GW[0]F1 [F-1] and the word line W[N-1]F1[F-1].

In some embodiments, another word line signal is transmitted in the global word line GW[0]F1[F-2] and the word line W[N-1]F1[F-2]. The method 800 further includes operations of transmitting, in response to another word line signal, still another data signal from the memory cell MC in the layer FL(F-1) of the memory array ARRAYN through the source line SL[0] and the bit line BL[0] in the memory array ARRAYN.

As described above, the memory devices of the present disclosure include selection switches coupled between global data lines and local data lines and configured to selectively transmit data signals from a specific array among multiple memory arrays. The local data lines have a U-shaped/W-shaped structure to connect memory cells arranged in adjacent columns. Furthermore, the memory cells in the same column of various memory arrays are coupled to a same global word line. Accordingly, the number of word line decoders/drivers reduces.

In some embodiments, a memory device is disclosed, including multiple arrays coupled in parallel with each other. A first array of the arrays includes a first switch and multiple first memory cells that are arranged in a first column, a second switch and multiple second memory cells that are arranged in a second column, a first data line and a second data line. The first data line is coupled to the first memory cells and the second memory cells. The second data line is coupled connected to the first memory cells and the second memory cells. The first switch transmits a data signal in the first data line in response to a control signal. The second switch outputs the data signal received from the second data line in response to the control signal. In some embodiments, the data signal corresponds to a logic state of one memory cell in the first memory cells and the second memory cells. In some embodiments, one of the first memory cells and one of the second memory cells are arranged in a first layer. The first and second switches are arranged in a second layer vertically above the first layer. In some embodiments, control terminals of the first and second switches are coupled in parallel to receive the control signal. In some embodiments, one of the first memory cells and one of the second memory cells are arranged adjacent to each other in a row direction and are configured to be activated in response to different word line signals. In some embodiments, the first data line includes first and second portions that extend in a column direction and a third portion extending in a row direction. First and second terminals of the third portion are coupled to one of the first memory cells and one of the second memory cells respectively. In some embodiments, the memory device further includes multiple word lines each configured to transmit one of multiple word line signals to one of the first memory cells and the second memory cells separately. In some embodiments, the first and second switches, the first and second memory cells, and the first and second data lines are arranged in a memory array. The memory device further includes multiple memory arrays. Memory cells in first rows and the first columns of the memory arrays are configured to be activated in response to a word line signal.

Also disclosed is a memory device that includes multiple memory arrays each including multiple switches and multiple memory cells in multiple columns and a first word line. The switches are configured to be selectively turned on in response a control signal. The first word line is coupled to first memory cells arranged in N-th rows and M-th columns in the memory arrays, in which N and M are positive integers. One of the first memory cells is configured to be operated, in response to a word line signal received from the first word line, to transmit a data signal through the turned on switches. In some embodiments, each of the memory arrays further includes at least one first data line and at least one second data line. The at least one first data line is coupled to a first switch of the switches and first terminals of the memory cells, and configured to receive the data signal. The at least one second data line is coupled to a second switch of the switches and second terminals of the memory cells, and configured to output the data signal. In some embodiments, the memory cells are arranged in four columns, and the first and second switches of the switches are arranged in first and second columns of the four columns. In some embodiments, the switches are arranged in a first layer, and the memory cells are arranged in a second layer vertically below the first layer. In some embodiments, each of the memory arrays further includes first and second data lines coupled to the memory cells. The memory device further includes third and fourth data lines. The third data line is configured to be selectively coupled to one of the first data lines through a first switch of the switches. The fourth data line is configured to be selectively coupled to one of the second data lines through a second switch of the switches. In some embodiments, the first and second data lines have first portions extending in a first direction and second portions extending in a second direction different from the first direction, and the third and fourth data lines extending in a third direction different from the first and second directions. In some embodiments, the switches are coupled through a connection line extending in the second direction. In some embodiments, when the switches in a first memory array of the arrays are turned on, the switches in other memory arrays of the arrays are turned off.

Also disclosed is a method including the following operations: turning on, in response to a first control signal, a series of switches in a first memory array of multiple memory arrays coupled in parallel to couple a first data line with a second data line and to couple a third data line with a fourth data line; and performing an operation, in response to a first word line signal, to a memory cell of multiple memory cells in the first memory array to transmit a first data signal through the first to fourth data lines. The memory cells in the first memory array have first terminals coupled together through the first data line and second terminals coupled together through the third data line. In some embodiments, the method further includes operations of turning on, in response to a second control signal, a series of switches in a second memory array of the memory arrays to couple a fifth data line with the second data line and to couple a sixth data line with the fourth data line, when the series of switches in the first memory array of the memory arrays are turned off. In some embodiments, the method further includes operations of performing an operation, in response to the first word line signal, to a memory cell of multiple memory cells in the second memory array, wherein the memory cell of the memory cells in the second memory array is coupled to the fifth and sixth data lines. In some embodiments, the method further includes operations of transmitting, in response to a second word line signal, a second data signal from a memory cell of multiple memory cells in the second memory array through the first, second, fifth and sixth data lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a plurality of arrays coupled in parallel with each other, wherein a first array of the plurality of arrays comprises:
        a first switch and a plurality of first memory cells that are arranged in a first column;
        a second switch and a plurality of second memory cells that are arranged in a second column;
        a first data line coupled to the plurality of first memory cells and the plurality of second memory cells, wherein the first switch is configured to transmit a data signal in the first data line in response to a control signal; and
        a second data line coupled to the plurality of first memory cells and the plurality of second memory cells, wherein the second switch is configured to output the data signal at a first terminal of the second switch to a sense amplifier, wherein the data signal is received at a second terminal, different from the first terminal, of the second switch from the first switch through the second data line in response to the control signal.

2. The memory device of claim 1, wherein the data signal corresponds to a logic state of one memory cell in the plurality of first memory cells and the plurality of second memory cells.

3. The memory device of claim 1, wherein one of the plurality of first memory cells and one of the plurality of second memory cells are arranged in a first layer;
    wherein the first and second switches are arranged in a second layer vertically above the first layer.

4. The memory device of claim 3, wherein control terminals of the first and second switches are coupled in parallel to receive the control signal.

5. The memory device of claim 1, wherein one of the plurality of first memory cells and one of the plurality of second memory cells are arranged adjacent to each other in a row direction and are configured to be activated in response to different word line signals.

6. The memory device of claim 1, wherein the first data line comprises:
    first and second portions that extend in a column direction; and
    a third portion extending in a row direction, wherein first and second terminals of the third portion are coupled to one of the plurality of first memory cells and one of the plurality of second memory cells respectively.

7. The memory device of claim 1, further comprising:
    a plurality of word lines each configured to transmit one of a plurality of word line signals to one of the plurality of first memory cells and the plurality of second memory cells separately.

8. The memory device of claim 1, wherein the first and second switches, the plurality of first and second memory cells, and the first and second data lines are arranged in a memory array;
    wherein the memory device further comprises a plurality of the memory arrays;
    wherein memory cells in first rows and first columns of the plurality of the memory arrays are configured to be activated in response to a word line signal.

9. A memory device, comprising:
    a plurality of memory arrays each comprising a plurality of switches and a plurality of memory cells in a plurality of columns, wherein the plurality of switches are configured to be selectively turned on in response a control signal,
    wherein the plurality of memory arrays are separated from each other in a first direction; and
    a first word line coupled to first memory cells that are arranged in N-th rows and M-th columns in each memory array of the plurality of memory arrays, wherein N and M are positive integers;
    wherein one of the first memory cells is configured to be operated, in response to a word line signal received from the first word line, to transmit a data signal through turned-on switches in the plurality of switches, wherein the turned-on switches are arranged in the same row and control gates of the turned-on switches are coupled to the same connection line.

10. The memory device of claim 9, wherein each of the plurality of memory arrays further comprises:

at least one first data line coupled to a first switch of the plurality of switches and first terminals of the plurality of memory cells, and configured to receive the data signal; and at least one second data line coupled to a second switch of the plurality of switches and second terminals of the plurality of memory cells, and configured to output the data signal.

11. The memory device of claim 10, wherein the plurality of memory cells are arranged in four columns, and
the first and second switches of the plurality of switches are arranged in first and second columns of the four columns.

12. The memory device of claim 9, wherein the plurality of switches are arranged in a first layer, and the plurality of memory cells are arranged in a second layer vertically below the first layer.

13. The memory device of claim 9, wherein each of the plurality of memory arrays further comprises:
first and second data lines coupled to the plurality of memory cells;
wherein the memory device further comprises:
third and fourth data lines, wherein the third data line is configured to be selectively coupled to one of the first data lines through a first switch of the plurality of switches, and
the fourth data line is configured to be selectively coupled to one of the second data lines through a second switch of the plurality of switches.

14. The memory device of claim 13, wherein
the first and second data lines have first portions extending in a second direction different from the first direction and second portions extending in a third direction different from the first and second directions, and
the third and fourth data lines extending in the first direction.

15. The memory device of claim 14, wherein the plurality of switches are coupled through a connection line extending in the third direction.

16. The memory device of claim 9, wherein when the plurality of switches in a first memory array of the plurality of arrays are turned on, the plurality of switches in other memory arrays of the plurality of arrays are turned off.

17. A method, comprising:
turning on, in response to a first control signal, a series of switches in a first memory array of a plurality of memory arrays coupled in parallel to couple a first data line with a second data line and to couple a third data line with a fourth data line; and
performing an operation, in response to a first word line signal, to a memory cell of a plurality of memory cells in the first memory array to transmit a first data signal, associated with a logic state of the memory cell, through the first to fourth data lines,
wherein a first switch, that is coupled between the third date line and the fourth line, in the series of switches receives the first data signal at a first terminal of the first switch, and outputs the first data signal at a second terminal, different from the first terminal, of the first switch to a sense amplifier;
wherein the plurality of memory cells in the first memory array have first terminals coupled together through the first data line and second terminals coupled together through the third data line.

18. The method of claim 17, further comprising:
when the series of switches in the first memory array of the plurality of memory arrays are turned off,
turning on, in response to a second control signal, a series of switches in a second memory array of the plurality of memory arrays to couple a fifth data line with the second data line and to couple a sixth data line with the fourth data line.

19. The method of claim 18, further comprising:
performing an operation, in response to the first word line signal, to a memory cell of a plurality of memory cells in the second memory array, wherein the memory cell of the plurality of memory cells in the second memory array is coupled to the fifth and sixth data lines.

20. The method of claim 18, further comprising:
transmitting, in response to a second word line signal, a second data signal from a memory cell of a plurality of memory cells in the second memory array through the first, second, fifth and sixth data lines.

* * * * *